United States Patent
Okunuki et al.

(10) Patent No.: US 7,611,810 B2
(45) Date of Patent: Nov. 3, 2009

(54) CHARGED BEAM PROCESSING APPARATUS

(75) Inventors: Masahiko Okunuki, Tokyo (JP); Haruhito Ono, Minamiashigara (JP); Shinan Wang, Kashiwa (JP); Kenji Tamamori, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 262 days.

(21) Appl. No.: 11/678,244

(22) Filed: Feb. 23, 2007

(65) Prior Publication Data
US 2008/0067437 A1    Mar. 20, 2008

(30) Foreign Application Priority Data
Feb. 28, 2006 (JP) .............. 2006-052005

(51) Int. Cl.
*G03F 9/00* (2006.01)
(52) U.S. Cl. ..................... 430/30; 430/22
(58) Field of Classification Search ............ 250/396 R, 250/309, 492.21
See application file for complete search history.

(56) References Cited

U.S. PATENT DOCUMENTS

| | | | | |
|---|---|---|---|---|
| 4,785,187 | A | 11/1988 | Kariya et al. | 250/491.1 |
| 4,812,662 | A | 3/1989 | Goto et al. | 250/491.1 |
| 4,897,552 | A | 1/1990 | Okunuki et al. | 250/492.2 |
| 4,974,736 | A | 12/1990 | Okunuki et al. | 219/121.12 |
| 5,525,806 | A * | 6/1996 | Iwasaki et al. | 250/492.21 |
| 5,831,715 | A * | 11/1998 | Takahashi | 355/53 |
| 6,037,601 | A | 3/2000 | Okunuki | 250/492.23 |
| 6,054,713 | A | 4/2000 | Miyake et al. | 250/492.24 |
| 6,117,598 | A * | 9/2000 | Imai | 430/22 |
| 6,303,932 | B1 * | 10/2001 | Hamamura et al. | 250/309 |
| 6,603,128 | B2 | 8/2003 | Maehara et al. | 250/441.11 |
| 6,699,630 | B2 * | 3/2004 | Ota | 430/30 |
| 6,758,900 | B1 * | 7/2004 | Matsui | 117/89 |

(Continued)

FOREIGN PATENT DOCUMENTS

JP    5-047636    2/1993

(Continued)

OTHER PUBLICATIONS

A. N. Broers, et al., "Electron-Beam Fabrication of 80-Å Metal Structures", Nov. 1976, pp. 596-598.

(Continued)

*Primary Examiner*—Nikita Wells
*Assistant Examiner*—Johnnie L Smith
(74) *Attorney, Agent, or Firm*—Fitzpatrick, Cella, Harper & Scinto

(57) ABSTRACT

A charged beam processing apparatus for processing an object to form structures on the object includes a processing chamber, a multi-charged beam optical system configured to generate a plurality of charged beams, and to converge and to deflect the plurality of charged beams to irradiate the object in the processing chamber with the plurality of charged beams, and a supply port configured to supply a gas into the processing chamber. The multi-charged beam optical system includes (i) a lens array, and (ii) a pattern forming plate configured to select a portion of the lens array to be used to form the structures. The charged beam processing apparatus includes a controller configured to control an exchange of the pattern forming plate in accordance with an arrangement pattern of the structures to be formed on the object.

7 Claims, 10 Drawing Sheets

U.S. PATENT DOCUMENTS

| | | | |
|---|---|---|---|
| 6,787,784 B1 | 9/2004 | Okunuki | 250/492.22 |
| 6,872,950 B2 | 3/2005 | Shimada et al. | 250/396 R |
| 6,872,951 B2 | 3/2005 | Yagi et al. | 250/396 R |
| 6,903,345 B2 | 6/2005 | Ono et al. | 250/396 R |
| 6,953,938 B2 | 10/2005 | Iwasaki et al. | 250/396 R |
| 6,965,153 B1 | 11/2005 | Ono et al. | 257/448 |
| 7,060,984 B2 | 6/2006 | Nagae et al. | 250/396 R |
| 7,109,494 B2 * | 9/2006 | Ono et al. | 250/396 R |
| 7,189,979 B2 | 3/2007 | Okunuki et al. | 250/492.2 |
| 2004/0061064 A1 * | 4/2004 | Ono et al. | 250/396 R |
| 2005/0077475 A1 * | 4/2005 | Nagae et al. | 250/396 R |

FOREIGN PATENT DOCUMENTS

| | | |
|---|---|---|
| JP | 2001-107252 | 4/2001 |
| JP | 2004-244649 | 9/2004 |
| JP | 2004-345009 | 12/2004 |

OTHER PUBLICATIONS

S. Matsui, K. Mori, "New Selective Deposition Technology By Electron Beam Induced Surface Reaction", Jan./Feb. 1986, pp. 299-304.

H. W. P. Koops, R. Weiel, D. P. Kern & T. H. Baum, "High-Resolution Electron-Beam Induced Deposition", Jan./Feb. 1988, pp. 477-481.

* cited by examiner

MEMS PROCESS SUBSTRATE

MEMS PROCESS SUBSTRATE

MEMS PROCESS SUBSTRATE

CHARGED BEAM CVD PROCESS

LIGHT-SHIELDING MASK

LIGHT-SHIELDING MASK

DEPOSITION PATTERN

DEPOSITION PATTERN

VIEW SHOWING INTERMEDIATE PROCESS OF MULTI CHARGED BEAM CVD

VIEW SHOWING MULTI ELECTRON BEAM SCANNING

VIEW SHOWING FINISHED DEVICE

OVERALL PROCESS FLOWCHART

DEVICE SUBSTRATE PREPARATION

PROCESSING PREPARATION

WORKING PROCESS

CHARGED BEAM PROCESSING APPARATUS

This application claims the benefit of Japanese Patent Application No. 2006-052005, filed Feb. 28, 2006, which is hereby incorporated by reference herein in its entirety.

BACKGROUND OF THE INVENTION

1. Field of the Invention

The present invention relates to a charged beam processing apparatus, which forms a structure by a direct process using a charged beam, such as an electron beam or an ion beam.

2. Description of the Related Art

Research on CVD (Chemical Vapor Deposition) using a focused electron beam were performed in the 1950s using, e.g., an experiment in which a gas is decomposed in a vacuum, carbon is deposited on an object surface, and the state of a beam shape is inspected. From 1970 to the 1980s, A. N. Broers, Appl. Phys. Lett. 29 (1976), page 596, S. Matsui, K. Mori, J. Vac. Sci. and Technol. B4, (1986) page 299, H. W. P. Koops, R. Weiel, D. P. Kern and T. H. Baum, J. Vac. Sci. and Technol. B6, (1988) page 477, et al., conducted studies on practical applications. Mask formation and tungsten micropattern formation by electron beam CVD, formation of an ultrafine rod having a nanometer size, and formation of a field emitter as a field emission electron source were attempted in those days. Formation of these structures employed a reactive gas, such as $WF_6$, $W(CO)_6$, $Mo(CO)_6$, $Fe(CO)_6$, $Me_2Au$ (tfac), or $Me_2Au$ (acac) as a precursor. An apparatus used in these application was prepared mainly by adding a gas supply mechanism to an existing electron beam apparatus (Japanese Patent Application Laid-Open No. 5-47636).

Subsequently, research on forming a structure using maskless charged beam CVD technology also progressed using a focused ion beam (FIB) apparatus, in addition to the electron beam apparatus. It was verified that the FIB apparatus can form an arbitrary three-dimensional structure by controlling the beam position of a Ga ion beam highly accurately, based on the design information on the three-dimensional structure (Japanese Patent Application Laid-Open No. 2001-107252 and No. 2004-345009). Also, Furuya, et al. attempted to form a nano-size three-dimensional structure using a high-energy focused electron beam of a transmissive electron microscope by arranging an object to be processed in a magnetic field (Japanese Patent Application Laid-Open No. 2004-244649).

These accomplishments showed that the supply of a precursor gas into a processing chamber and highly accurate control of a focused charged beam enabled not only formation of a comparatively simple structure, such as a wiring pattern or a needle for a field emission type emitter, but also, formation of a nanometer-size three-dimensional structure having a complicated arbitrary shape. The research of this field thus developed greatly.

Although the above fabrication schemes can form a structure for trial and study as they are proven to be able to form an arbitrary shape with a focused charged beam, they have problems in terms of productivity as a practical technique, which can be used to produce a large amount of identical items at a low cost.

SUMMARY OF THE INVENTION

It is an object of the present invention to solve the problems in the prior art described above.

The present invention provides a charged beam processing apparatus comprising a multi-charged beam optical system which converges a plurality of charged beams by a lens, and deflects the plurality of charged beams by a deflector to irradiate an object to be processed in a processing chamber, and a supply unit which supplies a gas into the processing chamber. The charged beam processing apparatus comprises a gas controller, which controls the gas to be supplied into the processing chamber based on a processing condition, and a beam controller which controls the plurality of charged beams based on the processing condition, wherein a structure is formed by at least one of material deposition on the surface of the object and etching of the surface of the object.

According to a preferred embodiment of the present invention, the processing apparatus can further comprise a charged beam arrangement setting unit, which sets the arrangement of the plurality of charged beams based on information regarding periodical arrangement of the structure. The plurality of charged beams, the arrangement of which is set by the charged beam arrangement setting unit, can be turned on/off simultaneously to form the structure.

According to another preferred embodiment of the present invention, the charged beam arrangement setting unit can determine the arrangement of the charged beams by the lens arrangement of a multi-lens array.

According to still another preferred embodiment of the present invention, the charged beam arrangement setting unit can coincide with a basic period of the structure and comprise a plate, which selects and allows the plate to pass, of the plurality of charged beams which pass through the multi-lens array, those which match the structure.

According to still another preferred embodiment of the present invention, the plate can be arranged before the multi-lens array.

According to still another preferred embodiment of the present invention, the multi-lens array and the plate are exchangeable in accordance with the processing condition.

According to still another preferred embodiment of the present invention, the processing apparatus can further comprise a unit that turns on/off and switches the gas to be supplied to the processing chamber on the basis of the processing condition.

According to still another preferred embodiment of the present invention, the structure can comprise a photonic crystal or a field emitter array.

According to the present invention, the maskless multi beam CVD and etching process improve the productivity, to enable fabrication of a high-value-added device having a three-dimensional structure at a low cost.

Further features of the present invention will become apparent from the following description of exemplary embodiments with reference to the attached drawings.

BRIEF DESCRIPTION OF THE DRAWINGS

FIGS. 4A to 4D are views showing an example of device fabrication using the apparatus in FIG. 1, in which FIGS. 4A to 4C are views to explain an MEMS process substrate, and FIG. 4D is a view to explain a charged beam CVD process;

FIGS. 5A to 5D are views showing another example of the device fabrication using the apparatus in FIG. 1, in which FIGS. 5A and 5B are views to explain light-shielding masks, and FIGS. 5C and 5D are views to explain deposition patterns;

DESCRIPTION OF THE EMBODIMENTS

A processing method and a processing apparatus using a charged beam according to the present invention, and a device fabricated using the processing apparatus will be described with reference to the accompanying drawings.

Figure 1:
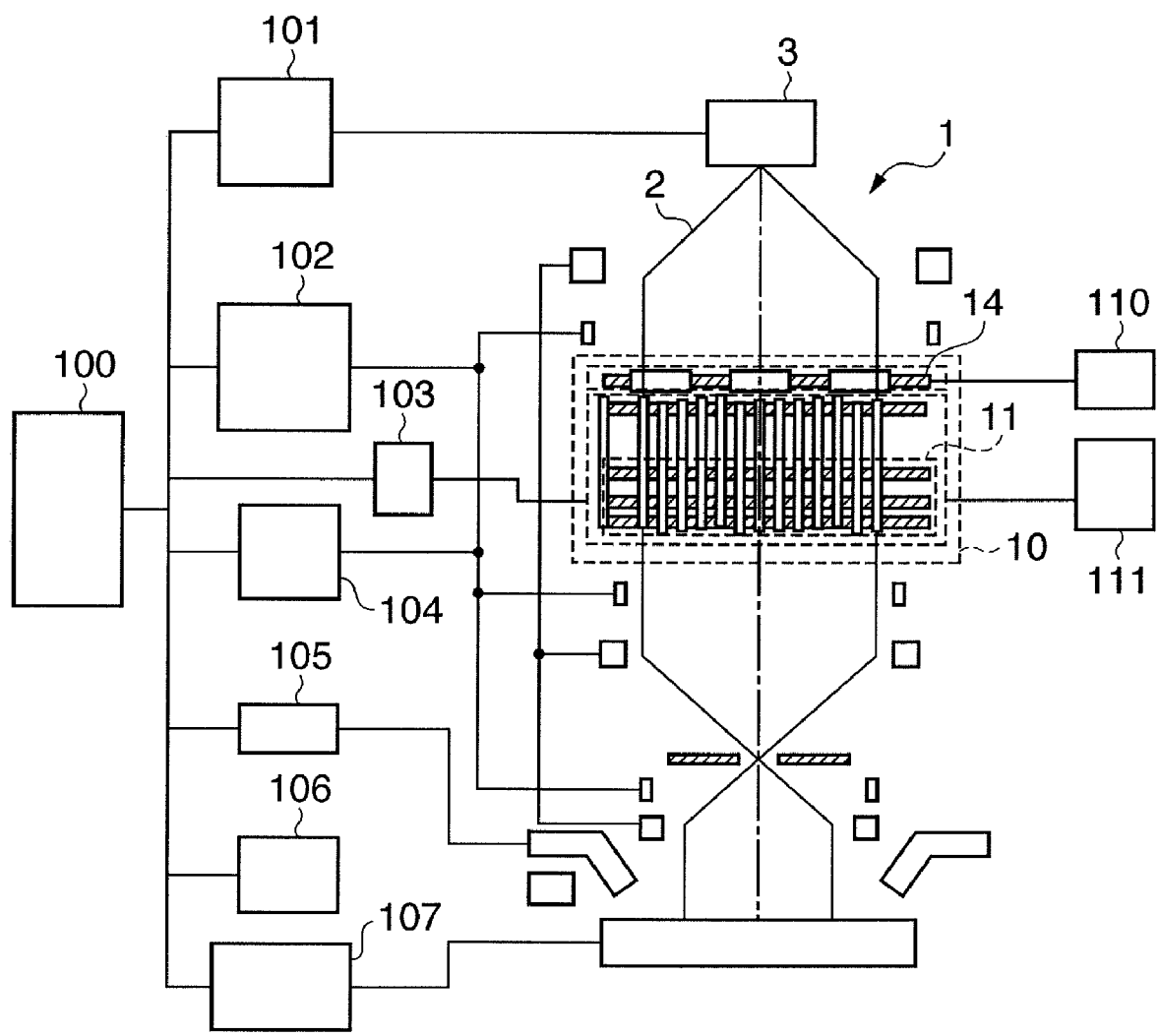
FIG. 1 is an overall view of a multi-charged beam processing apparatus according to an embodiment of the present invention.
Figure 2:
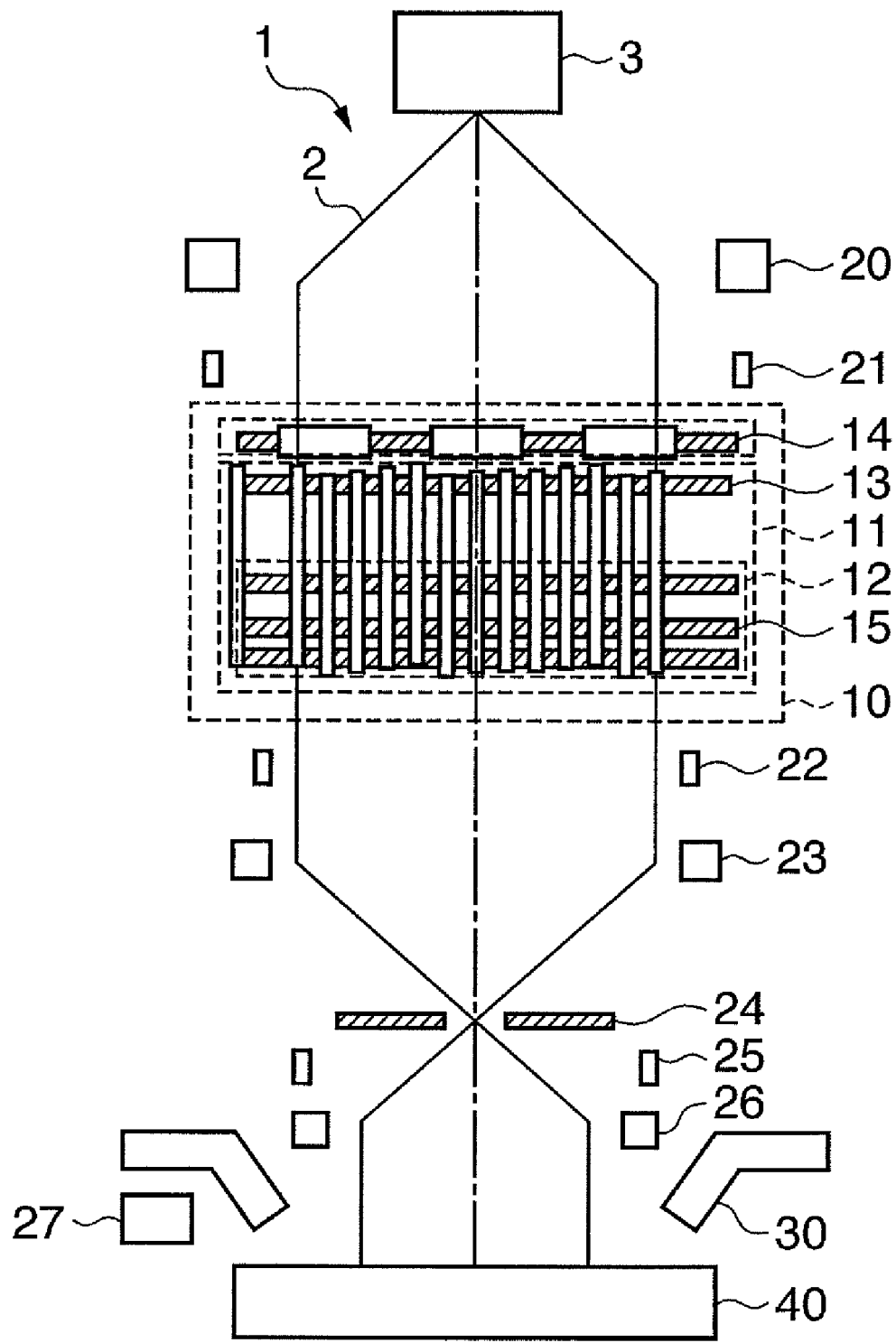
FIG. 2 is a detailed view of the main body portion of the multi-charged beam processing apparatus shown in FIG. 1.

FIG. 1 shows an overall view of a multi-charged beam processing apparatus according to an embodiment of the present invention, and FIG. 2 shows a detailed view of a main body 1 of the multi-charged beam processing apparatus in FIG. 1. Referring to FIGS. 1 and 2, the main body 1 of the multi-charged beam processing apparatus comprises a charged beam source 3, which generates an electron beam or an ion beam, a multi-patterned beam forming unit 10, lenses 20, 23 and 26 to determine the shapes of a plurality of charged beams, and deflectors 21, 22, and 25. The main body of the multi-charged beam processing apparatus also comprises a gas supply port 30 to perform charged beam CVD and etching, a secondary electron detector 27 to capture secondary electrons generated by an object to be processed, and a stage 40 to mount the object on it.

The lens 20 shapes a charged beam 2 emitted from the charged beam source 3 into a parallel beam to enter the multi-patterned beam forming unit 10. When passing through the multi-patterned beam forming unit 10, the parallel beam is divided into a plurality of beams that form multi beams, and the arrangement of the multi beams is determined. The lenses 23 and 26 on the lower level reduce the charged beams to irradiate the object on the stage 40. The deflector 22 has a function of adjusting the entering positions of the beams onto the object, as well as a function as a multi-charged beam blanker. An aperture plate 24 blocks the blanked charged beams. The deflector 25 is used to scan the charged beams, passing through the opening of the aperture plate 24, on the object. The shapes of the charged beams are determined in accordance with the positions and currents of the charged beams that match the shape of a structure to be formed by processing, and furthermore, a precursor gas to be supplied from the gas supply port.

The internal arrangement of the multi-patterned beam forming unit 10 of this embodiment will be described. Referring to FIG. 2, first, a multi-pattern forming plate 14 selects that region of the beam, entering the multi-patterned beam forming unit 10 to be parallel to it, which is to irradiate the object. A multi-beam forming unit 11 forms a plurality of charged beams. More specifically, a multi-beam dividing plate 13 has beam dividing apertures to correspond to the lens apertures of a multi-lens array 12. Corresponding lenses of the multi-lens array 12 act on the plurality of charged beam divided by the multi-beam dividing plate 13, so the beams uniformly converge on the lower level of the multi-lens array 12. The main body 1 of the charged beam processing apparatus controls operation concerning formation of the multi-beams by the respective controllers in FIG. 1.

Referring to FIG. 1, an apparatus controller 100, which controls the entire apparatus, controls the basic portion of the charged beam optical system by a charged beam source controller 101, lens controller 102, multi-lens controller 103, and deflection controller 104. The charged beam source controller 101 sets the conditions under which the charged beam source 3 generates the charged beam, and stabilizes the charged beam. The lens controller 102 controls the converging operation of the charged beam. The multi-lens controller 103 sets the lens conditions of the multi-lens array 12. The deflection controller 104 controls position adjustment of the charged beam, blanking, and scanning of the charged beam.

The apparatus controller 100 also controls a gas supply controller 105, signal processor 106, and stage controller 107. The stage controller 107 moves the object in synchronism with scanning of the charged beam. The signal processor 106 converts a signal from the secondary electron detector 27 into an image. The apparatus controller 100 sets conditions, such as the gas type, pressure, supply timing, and the like, of the precursor gas, which is to be supplied from the gas supply controller 105, on the basis of the image.

The multi-pattern forming plate 14 can be exchanged in accordance with the device to be formed by processing. A multi-pattern forming plate controller 110 manages the multi-pattern forming plate 14 and controls the position of the plate 14. The multi-beam forming unit 11 can be exchanged in accordance with the arrangement period of the device to be processed. A multi-beam forming controller 111 manages the operation when exchanging the multi-beam forming unit 11, and adjusts the position of the multi-beam forming unit 11.

Figure 3:
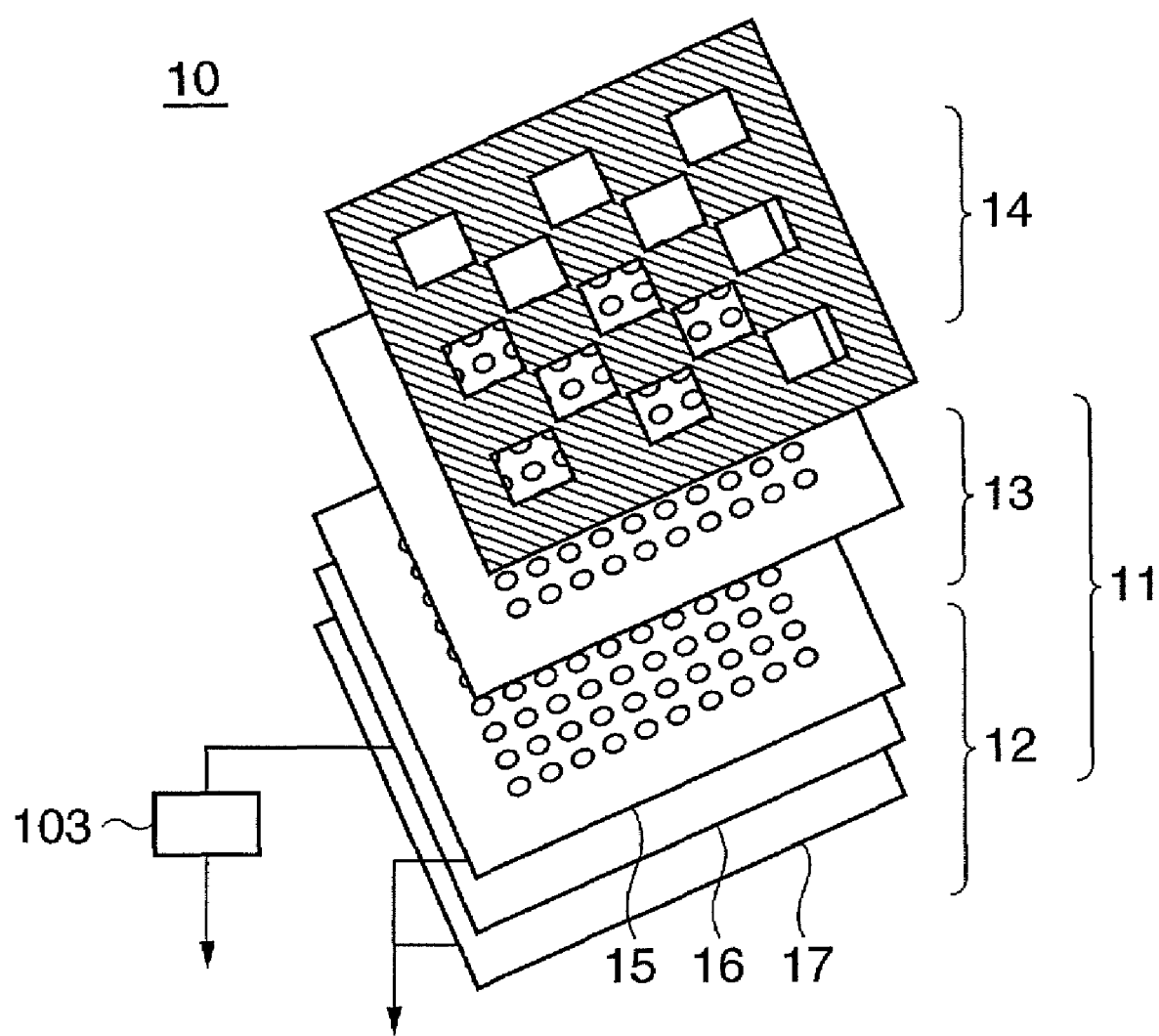
FIG. 3 is a detailed view of the multi-patterned beam forming unit in FIG. 2.

The multi-patterned beam forming unit 10 will be described in detail with reference to FIG. 3. The multi-patterned forming unit 10 includes the multi-beam forming unit 11 and multi-pattern forming plate 14. The multi-beam forming unit 11 includes the multi-lens array 12 and multi-beam dividing plate 13. The multi-lens array 12 comprises a total of three equipotential electrostatic lenses, i.e., a multi-lens control plate 15, the lens conditions of which are controlled by the multi-lens controller 13, and two multi-lens electrode plates 16 and 17. The aperture arrangement of the multi-lens array 12 reflects the periodical structure of the device to be processed. The pattern multi-pattern forming plate 14 selects apertures that correspond to regions to be processed. In device processing, the multi-beam forming controller 111 and multi-pattern forming plate controller 110 in FIG. 1 can exchange the multi-beam forming unit 11 and multi-pattern forming plate 14.

An example of device processing using the processing apparatus of this embodiment will be described with reference to FIGS. 4A to 4D. The use of the multi-type charged beam CVD of this embodiment realizes high-throughput device fabrication.

Figure 4A:
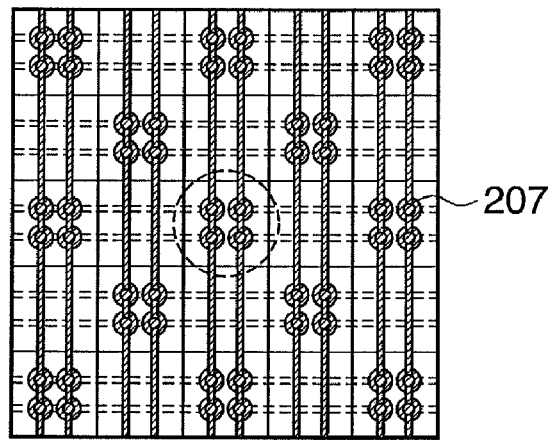

First, a MEMS process fabricates the basic device substrate of a field emitter array (FEA) in advance. FIG. 4A shows an example of a MEMS process substrate 201 having a staggered arrangement of a plurality of blocks, each comprising 2×2 emitter openings. A total of thirteen blocks, each comprising 2×2 emitter openings, are arranged on this substrate. A region, including the thirteen blocks, corresponds to a region which is to be irradiated at once by the multi-charged beam processing apparatus in FIG. 1.

Figure 4B:
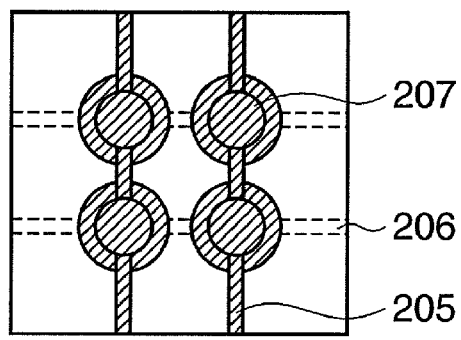
Figure 4C:
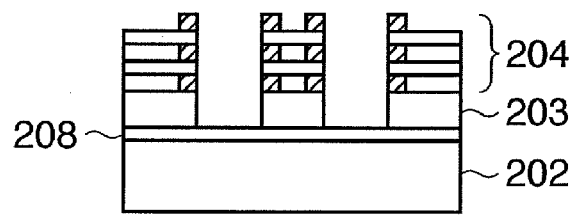

FIGS. 4B and 4C are upper and sectional views, respectively, showing in enlargement, the central portion of the MEMS process substrate 201 in FIG. 4A. The plan view of FIG. 4B shows wiring lines 205 and 206 and emitter openings 207. The sectional view of FIG. 4C shows the respective layers of an insulator 203 and electrode 204 stacked on a substrate 202.

Figure 4D:
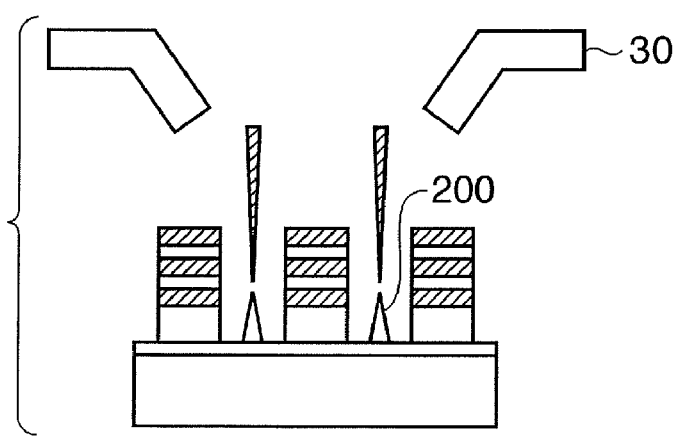

FIG. 4D shows the charged beam CVD process. A multi-patterned beam forming unit 10 used in this process comprises the arrangement shown in FIG. 3. More specifically, the multi-patterned beam forming unit 10 comprises the multi-beam forming unit 11 having 10×10 openings and the multi-pattern forming plate 14 having the staggered arrangement of the openings of the thirteen blocks shown in FIG. 3. This allows a simultaneous CVD process, which uses fifty-two beams, passing through the openings of the thirteen blocks, among 10×10 multi charged beams, to form the emitters 201 at once in fifty-two emitter openings formed in the MEMS process substrate in FIG. 4A.

Figure 5A:
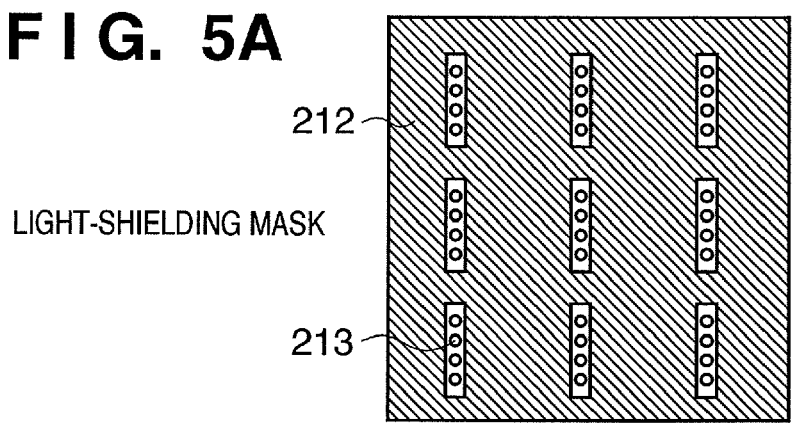
Figure 5B:
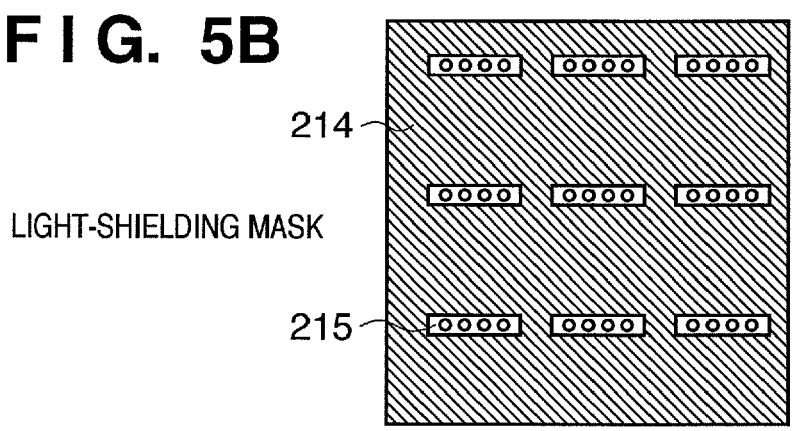
Figure 5C:
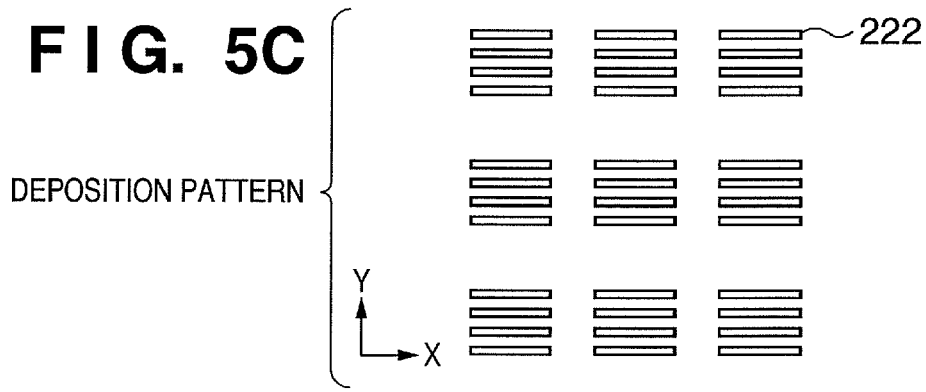
Figure 5D:
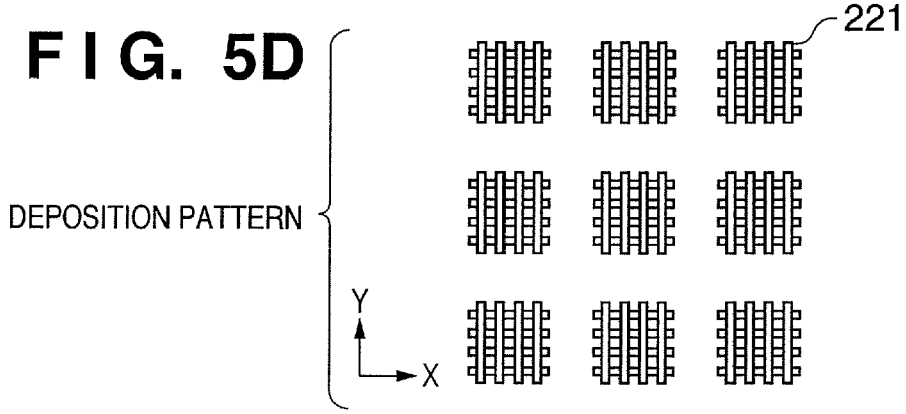
Figure 6A:
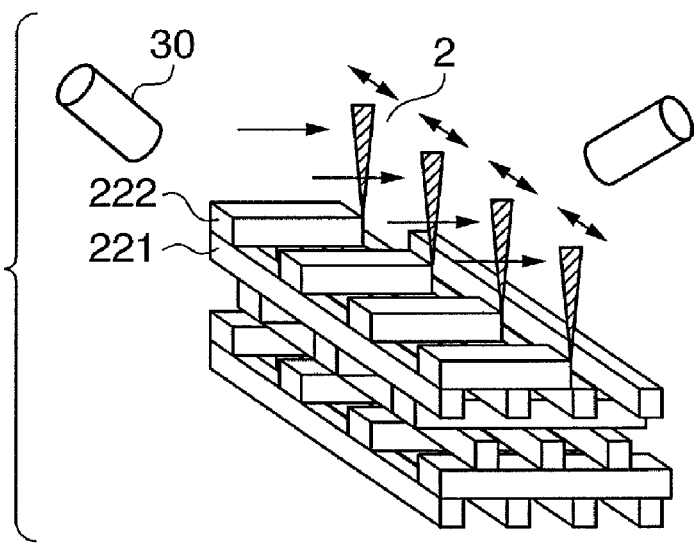
FIG. 6A is a view to explain an intermediate process in multi-charged beam CVD.
Figure 6B:
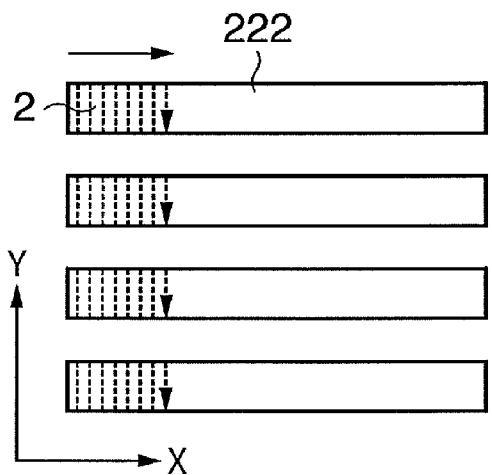
FIG. 6B is a view showing multi-charged beam scanning.
Figure 6C:
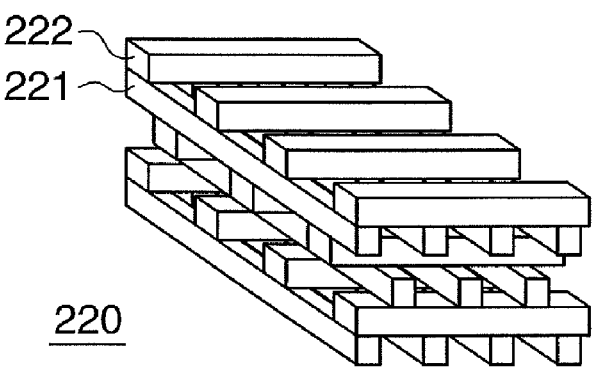
FIG. 6C is a view showing a finished device.

FIGS. 5A to 5D and FIGS. 6A to 6C show another example of device fabrication, which forms a photonic crystal having a wood pile three-dimensional structure. FIG. 6C is a view showing a finished photonic crystal structure. In this structure, periodically arranged rods combine in the X- and Y-axis directions. The charged beam CVD according to this embodiment can make use of this periodicity for increasing the throughput. The multi-charged beams are arranged with the period of the rod arrangement of the photonic crystal. In this way, 3×3 devices can be processed simultaneously with each device serving as a unit.

The light-shielding masks in FIGS. 5A and 5B serve to select multi beams to irradiate the object. Device processing of this example employs two types of multi-pattern forming plates 212 and 214. The plates 212 and 214, respectively, have openings 213 and 215 where charged beams pass. The respective openings are formed such that four beams in a vertical or horizontal array can pass through them. These openings are arranged with an arrangement of 3×3 on the plates 212 and 214. As the charged beams pass through the openings to irradiate the object simultaneously, 4×9=36 multi-beams process the device simultaneously.

FIG. 5C shows an example which employs the deflector 25 in FIG. 2 to scan beams in accordance with the multi-charged beam CVD method using the multi-pattern forming plate 212 so as to form rods 222 in the X direction. In FIG. 5D, after the formation of FIG. 5C, the multi-pattern forming plate 212 is exchanged to the multi-pattern forming plate 214 to form a large number of rods in the Y direction simultaneously in accordance with the same multi-charged beam CVD.

FIG. 6A shows an intermediate state of photonic crystal formation by the multi-charged beam CVD process, to form rods 222 in the X direction using the multi-pattern forming plate 212 in FIG. 5A. FIG. 6B shows the charged beam scanning state at this time. In this manner, in formation of a photonic crystal having a periodical structure, when the apparatus in FIG. 1 uses the multi-beam forming unit 11 and multi-pattern forming plate 14, which match this periodical structure in combination, simultaneous radiation of the multi-charged beam can perform maskless CVD processing. Hence, this processing method is industrially viable because it can provide a remarkably higher throughput than in the processing time of processing that employs the conventional single beam.

Figure 7A:
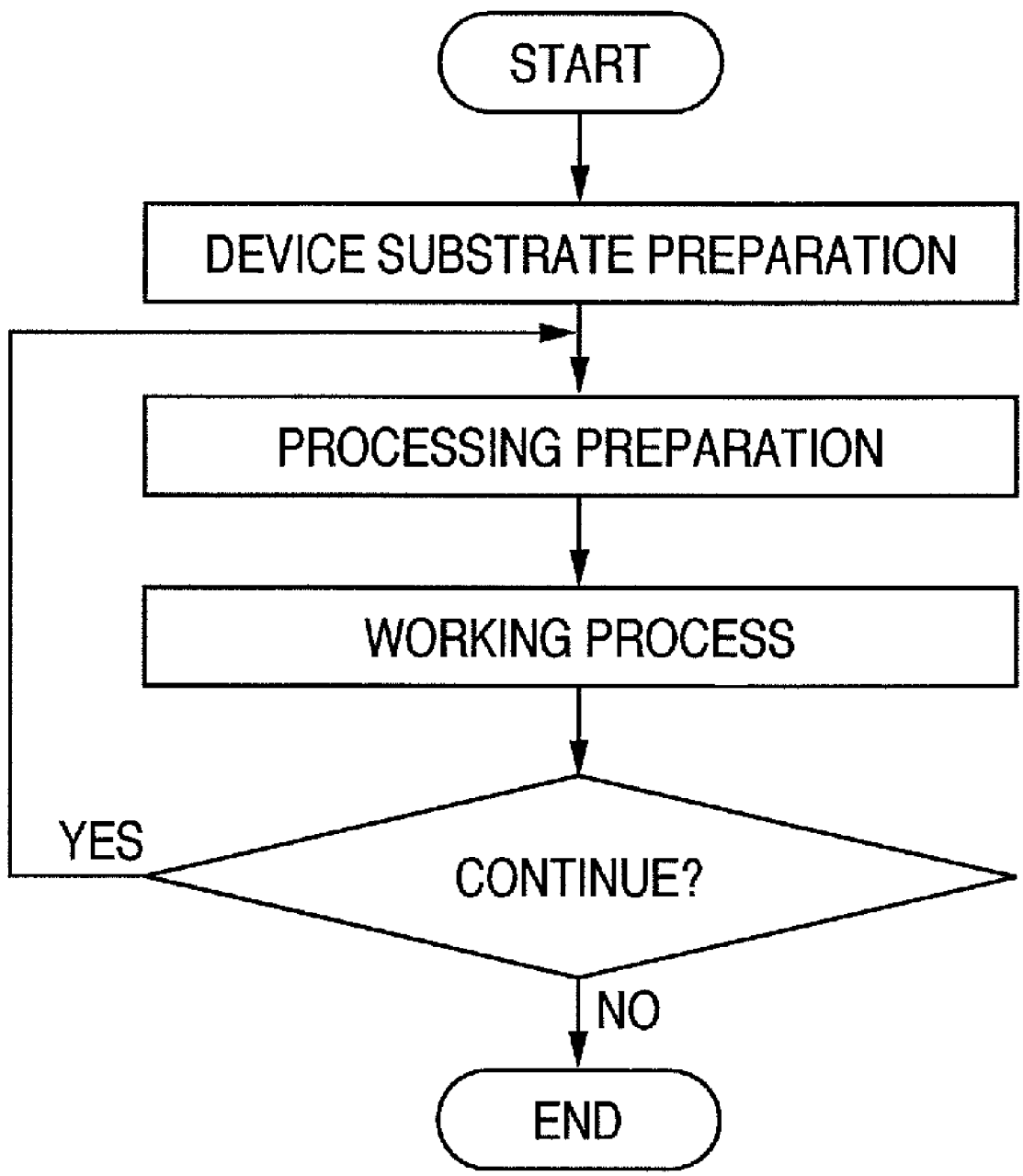
FIGS. 7A to 7D are flowcharts of the device fabrication.
Figure 7B:
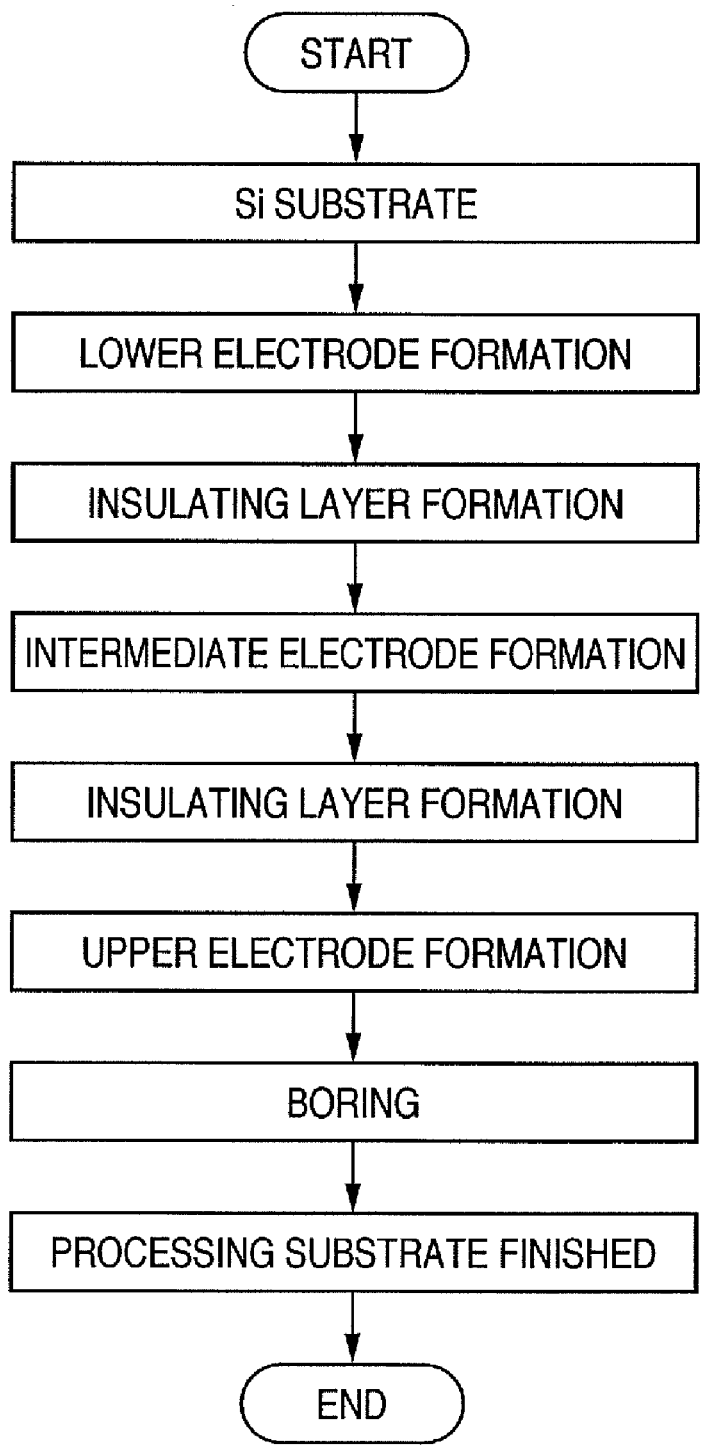
Figure 7C:
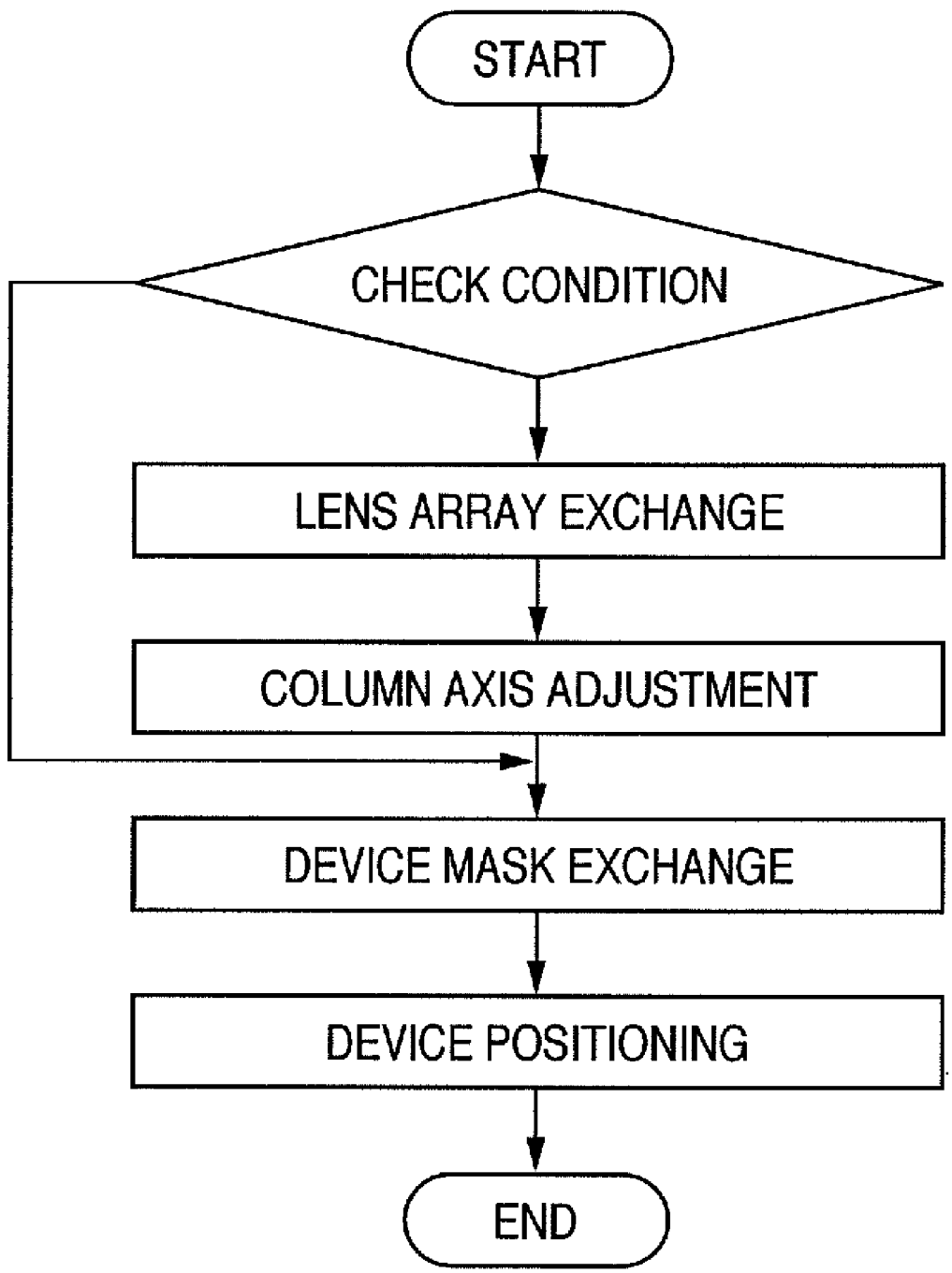
Figure 7D:
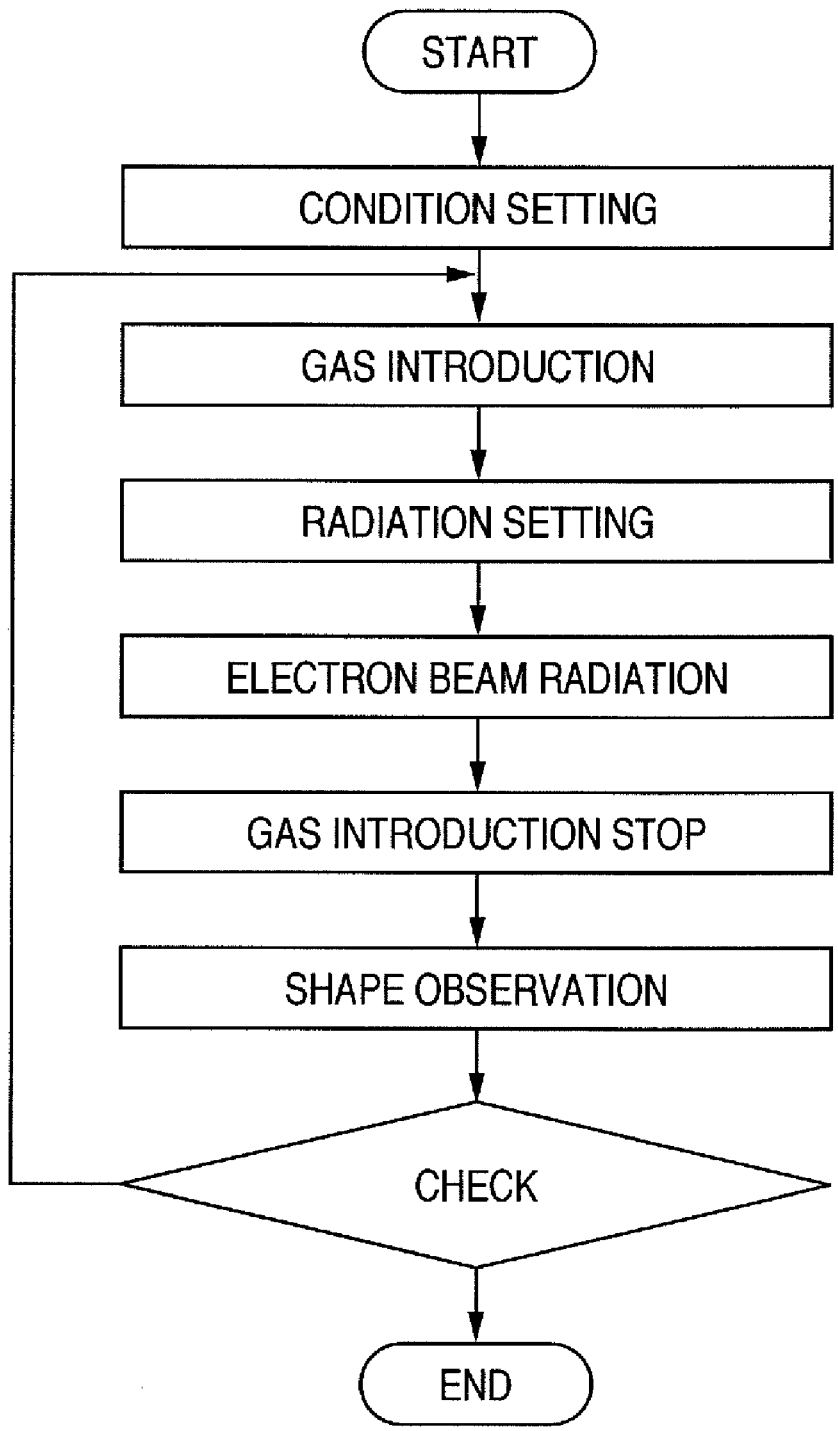

A series of device fabrication flows using multi-charged beams will be described with reference to FIGS. 7A to 7D. FIG. 7A is an overall process flowchart, which includes substrate preparation, processing preparation of the charged beam processing apparatus, and a working process. FIGS. 7B to 7D show the respective processes in FIG. 7A in detail. A fabrication process will be described by assuming the device fabrication example of FIGS. 4A to 4D described above.

In device substrate preparation in FIG. 7B, an Si substrate 202 is prepared. After a lower electrode 208 is formed on the substrate 202, an insulator 203 is formed, and an intermediate electrode to perform a lens operation is formed on the insulator 203. An insulating layer and an upper electrode are formed in multiple stages on the intermediate electrode. Dry etching is performed using a patterned resist as a mask to perform boring for emitter formation, thus finishing a process substrate.

The steps of processing preparation in FIG. 7C are directed to setting the charged beam processing apparatus in FIG. 1. First, the lens array 12 (FIG. 2) is exchanged to one having a periodical structure, the same as that of the device. After that, the column axis of the charged beam optical system is adjusted. After the exchanged multi-beam forming unit 11 is adjusted and checked particularly, the multi-pattern forming plate 14 is exchanged to a multi-pattern forming plate light-shielding mask 14, which is determined by the device to be formed. The device prepared in the previous steps is mounted in the apparatus and positioned, thus completing the processing preparation.

In the working process of FIG. 7D as the final process, the process takes place in accordance with the processing procedure, such as the type and pressure of the precursor gas and processing portions that are set in advance. First, the gas is supplied to the processing chamber, and a charged beam is radiated on the basis of the position of the charged beam and the preset radiation conditions. When the process is ended, gas supply is stopped. After that, the form of the obtained deposition structure is observed from a secondary electron image obtained by scanning the charged beam. The result is checked, and the series of processing steps are ended.

In the above device processing, unlike the electron beam drawing scheme, the idea of controlling turning on/off of the individual multi-beams independently is discarded. The process is performed under such conditions that all the multi-beams can constantly irradiate the object. When compared to the productivity of the conventional CVD processing that has been performed using a focused charged beam, the productivity improves by the number of multi-beams. Thus, a high-quality device can be manufactured at a low cost.

In the example of the above working process, a precursor gas is supplied as the supply gas to the processing chamber to perform formation by deposition. Conversely, the supply of a gas having an etching function can also achieve the process with a high productivity. Furthermore, the supply of a CVD gas and an etching gas alternately can achieve a high-speed process of a more complicated three-dimensional structure.

As has been described above, contrivance of the structure of the multi-pattern forming unit on the basis of the periodicity and pattern arrangement information on the device to be processed realizes a charged beam processing apparatus having a high productivity. As shown in the above embodiments, high-value-added devices having three-dimensional structures, such as a field emitter array or a photonic crystal, can be manufactured in a large amount and at a low cost. Namely, the maskless multi-beam CVD and etching process improve the productivity to enable fabrication of a high-value-added device having a three-dimensional structure, at a low cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A charged beam processing apparatus for processing an object to form structures on the object, the apparatus including a processing chamber, a multi-charged beam optical system configured to generate a plurality of charged beams, and to converge and to deflect the plurality of charged beams to irradiate the object in the processing chamber with the plurality of charged beams, and a supply port configured to supply a gas into the processing chamber, the multi-charged beam optical system comprising:
(i) a lens array; and
(ii) a pattern forming plate configured to select a portion of the lens array to be used to form the structures; and the charged beam processing apparatus comprising:
a controller configured to control an exchange of the pattern forming plate in accordance with an arrangement pattern of the structures to be formed on the object.

2. An apparatus according to claim 1, wherein the controller is further configured to control an exchange of the lens array in accordance with an arrangement period of the structures to be formed on the object.

3. An apparatus according to claim 1, wherein the pattern forming plate is configured to shield a charged beam not to enter a portion of the lens array.

4. An apparatus according to claim 1, wherein the supply port is configured to supply a gas for material deposition on the object or etching of the object.

5. An apparatus according to claim 1, wherein the apparatus is configured to process the object to form a photonic crystal.

6. The apparatus according to claim 1, wherein the apparatus is configured to process the object to form a field emitter array.

7. A method of manufacturing a device, the method comprising:

processing an object to form structures on the object using a charged beam processing apparatus according to claim 1.

* * * * *